US012627085B2

(12) United States Patent
Takamizawa

(10) Patent No.: US 12,627,085 B2
(45) Date of Patent: May 12, 2026

(54) BOARD MODULE WITH HEAT DISSIPATION PORTION AND ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shun Takamizawa, Yokkaichi (JP)

(73) Assignees: AutoNetworks Technologies, Ltd., Yokkaishi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 336 days.

(21) Appl. No.: 18/575,957

(22) PCT Filed: Jun. 29, 2022

(86) PCT No.: PCT/JP2022/025942
§ 371 (c)(1),
(2) Date: Jan. 2, 2024

(87) PCT Pub. No.: WO2023/282139
PCT Pub. Date: Jan. 12, 2023

(65) Prior Publication Data
US 2024/0339773 A1    Oct. 10, 2024

(30) Foreign Application Priority Data
Jul. 5, 2021    (JP) ................................ 2021-111425

(51) Int. Cl.
*H01R 12/71*        (2011.01)
*H05K 1/02*        (2006.01)
(Continued)

(52) U.S. Cl.
CPC ......... *H01R 12/712* (2013.01); *H05K 1/0201* (2013.01); *H05K 1/144* (2013.01); *H02G 3/081* (2013.01); *H05K 2201/042* (2013.01)

(58) Field of Classification Search
CPC .... H01R 12/712; H01R 12/716; H01R 12/73; H05K 1/0201; H05K 1/144;
(Continued)

(56) References Cited

U.S. PATENT DOCUMENTS 6,287,130 B1     9/2001   Torii
10,136,511 B2 *  11/2018  Kobayashi ................. C09J 7/22
(Continued)

FOREIGN PATENT DOCUMENTS

DE     112018006708 T5 *  9/2020   ......... H05K 7/14322
JP         H7-22476        4/1995
(Continued)

OTHER PUBLICATIONS

International Search Report, Application No. PCT/JP2022/025942, mailed Sep. 13, 2022. ISA/Japan Patent Office.

*Primary Examiner* — Travis S Chambers
(74) *Attorney, Agent, or Firm* — BROOKS KUSHMAN P.C.

(57) ABSTRACT

An object is to improve heat dissipation performance while reducing a distance between boards when circuits on the boards are electrically connected to each other. The board module includes a first board including a first circuit, and a first connector provided on the first board, and the first connector is connected to a second connector, a through hole is formed in the first board, the first connector includes a connector housing disposed in the through hole and a first terminal, the first terminal includes a first board-side end portion connected to the first circuit, a first terminal portion held by the connector housing, and a heat dissipation portion
(Continued)

provided between a first board-side end portion and the first terminal portion and exposed as seen from the opposite side to the second connector with respect to the connector housing.

8 Claims, 5 Drawing Sheets

(51) Int. Cl.
 *H05K 1/14*    (2006.01)
 *H02G 3/08*    (2006.01)

(58) Field of Classification Search
 CPC .... H05K 2201/042; H05K 7/20; H02G 3/081;
                  H02G 3/16
 See application file for complete search history.

(56)      References Cited

U.S. PATENT DOCUMENTS

| | | | | |
|---|---|---|---|---|
| 11,665,812 | B2 * | 5/2023 | Uchida | ................. H05K 7/205 |
| | | | | 174/252 |
| 2018/0351297 | A1 | 12/2018 | Suzuki et al. | |
| 2021/0359453 | A1 * | 11/2021 | Yamamoto | ............ H01R 12/57 |

FOREIGN PATENT DOCUMENTS

| | | | |
|---|---|---|---|
| JP | H11-144823 | A | 5/1999 |
| JP | 2009-129858 | A | 6/2009 |
| JP | 2015-005401 | A | 1/2015 |
| JP | 2017-010807 | A | 1/2017 |
| JP | 2019-008872 | A | 1/2019 |

* cited by examiner

BOARD MODULE WITH HEAT DISSIPATION PORTION AND ELECTRICAL JUNCTION BOX

CROSS-REFERENCE TO RELATED APPLICATIONS

This application is the U.S. national stage of PCT/JP2022/025942 filed on Jun. 29, 2022, which claims priority of Japanese Patent Application No. JP 2021-111425 filed on Jul. 5, 2021, the contents of which are incorporated herein.

TECHNICAL FIELD

The present disclosure relates to a board module and an electrical junction box.

BACKGROUND

JP 2009-129858A discloses an inter-board connection structure that electrically connects circuits of a first board and a second board to each other and includes a first female terminal disposed on a surface of the first board that faces the opposite side to the second board, a second female terminal disposed on a surface of the second board that faces the opposite side to the first board, and a male member that has a first male terminal at one end and a second male terminal at the other end. The male member extends through the first board and the second board, and is connected to the first female terminal and the second female terminal.

JP 2019-8872A discloses a connector that connects a board and an external terminal to each other, including a connector terminal portion connected to the board and the external terminal, and a housing portion that holds the connector terminal portion, in which the housing portion is installed on the board while extending through the board and protruding from two sides of the board in a height direction thereof.

Here, when connecting a connector provided on a board to another connector, downsizing of a structure for connection and improvement in heat dissipation performance are required. No consideration is given to heat dissipation performance in Patent Documents 1 and 2.

In view of this, an object of the present disclosure is to improve heat dissipation performance while downsizing a structure for connection when connecting a connector provided on a board to another connector.

SUMMARY

The board module according to the present disclosure is a board module including a first board including a first circuit, and a first connector provided on the first board, wherein the first connector is connected to a second connector, a through hole is formed in the first board, the first connector includes a connector housing disposed in the through hole and a first terminal, and the first terminal includes a first board-side end portion that is electrically and mechanically connected to the first circuit a first terminal portion held by the connector housing, and a heat dissipation portion provided between the first board-side end portion and the first terminal portion and exposed from the connector housing as seen from a side opposite to the second connector.

Advantageous Effects

According to the present disclosure, when connecting a connector provided on a board to another connector, heat dissipation performance can be improved while downsizing a structure for connection.

DETAILED DESCRIPTION OF PREFERRED EMBODIMENTS

Figure 1:
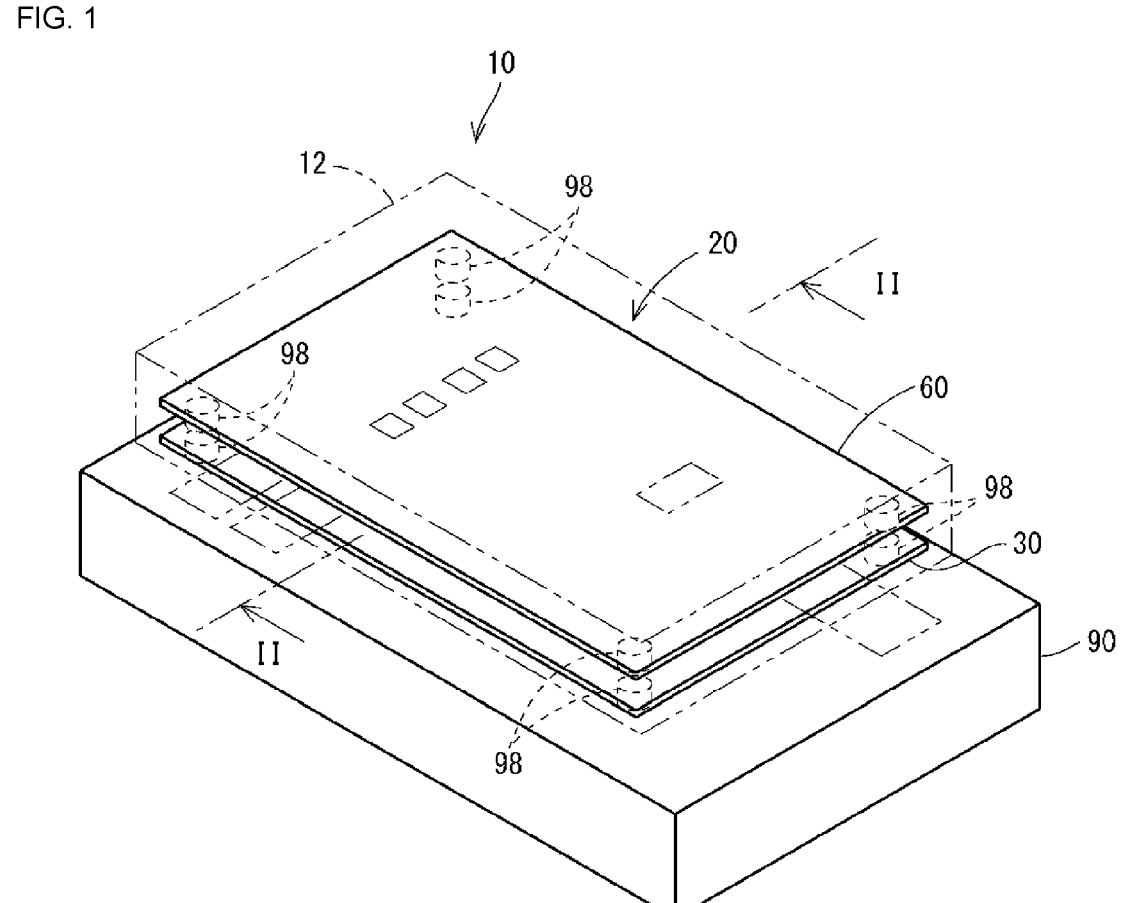
FIG. 1 is a schematic perspective view showing an electrical junction box including a board module according to an embodiment.

First, embodiments of this disclosure will be listed and described below.

A board module according to the present disclosure is as follows.

In a first aspect, a board module including a first board including a first circuit, and a first connector provided on the first board, wherein the first connector is connected to a second connector, a through hole is formed in the first board, the first connector includes a connector housing disposed in the through hole and a first terminal, and the first terminal includes a first board-side end portion that is electrically and mechanically connected to the first circuit a first terminal portion held by the connector housing, and a heat dissipation portion provided between the first board-side end portion and the first terminal portion and exposed from the connector housing as seen from a side opposite to the second connector.

According to this board module, the connector housing is disposed in the through hole formed in the first board, and the first terminal portion is held by the connector housing. As a result of the first connector and the second connector approaching each other, the first terminal portion and the second terminal portion of the second connector are connected to each other. Since the connector housing that holds the first terminal portion is disposed in the through hole, the structure for connection between the first connector and the second connector can be downsized. Also, since the first terminal is provided between the first board-side end portion and the first terminal portion, and includes the heat dissipation portion exposed as seen from the opposite side to the second connector, the heat dissipation performance can be improved.

In a second aspect, in the board module according to the first aspect, a configuration is also possible in which a second connector provided on a second board including a second circuit provided spaced apart from the first board, and the second connector includes a second terminal including a second board side end portion that is electrically and mechanically connected to the second circuit and a second terminal portion connected to the first terminal portion as a result of the first board and the second board approaching each other.

In a third aspect, in the board module according to the second aspect, a configuration is also possible in which the second board side end portion is electrically and mechanically connected to the second circuit on the first board-side with respect to the second board.

In a fourth aspect, in the board module according to any one of the first through the third aspects, a configuration is also possible in which the heat dissipation portion protrudes on an opposite side to the second connector with respect to the connector housing. With this configuration, excellent heat dissipation can be achieved.

In a fifth aspect, in the board module according to any one of the first through the fourth aspects, a configuration is also possible in which the heat dissipation portion is in contact with a heat dissipation promotion member in a heat conductive manner. In this manner, heat in the first terminal can be efficiently dissipated via the heat dissipation promotion member.

In a sixth aspect, in the board module according to any one of the first through the fifth aspects, a configuration is also possible in which a receiving portion that is in contact with the heat dissipation portion from an opposite side to the first connector in a direction in which the first connector and the second connector are connected to each other is further provided. In this manner, when connecting the connectors to each other, a force that acts on the first terminal portion is taken on by the receiving portion.

In a seventh aspect, in the board module according to any one of the first through the sixth aspects, a configuration is also possible in which the first terminal includes a stress absorption portion that can deform more easily than the first terminal portion, between the first board-side end portion and the first terminal portion. In this manner, when connecting the connectors to each other, a force that acts on the first terminal portion is mitigated due to deformation of the stress absorption portion, and thus the force is unlikely to be transferred to the first board-side end portion. Accordingly, the connection state between the first board-side end portion and the first circuit can be maintained.

In an eighth aspect, in the board module according to any one of the first through the seventh aspects, a configuration is also possible in which the first board-side end portion extends in a direction intersecting a direction in which the first connector and the second connector are connected to each other, and the first board-side end portion is electrically and mechanically connected to the first circuit on the second connector side with respect to the first board. When the first connector and the second connector are connected to each other, the first terminal is pressed away from the second connector. When the first board-side end portion that extends in the direction intersecting the connection direction is electrically and mechanically connected to the first circuit on the second connector side with respect to the first board, a force that presses the first terminal is taken on by the first board. In this manner, the connection state between the first board-side end portion and the first circuit can be maintained.

In a ninth aspect, in the board module according to any one of the first through the eighth aspects, a configuration is also possible in which a peg member that is held by the connector housing and in contact with the first board from the second connector side is further provided. In this manner, a force that acts when the first connector and the second connector are connected to each other is taken on by the peg member from the first terminal portion via the connector housing.

An electrical junction box according to the present disclosure is as follows.

In a tenth aspect, a board module according to any one of first through the ninth aspects, and a case that covers the board module. In this manner, in the electrical junction box, when the circuits of the boards are electrically connected to each other, the heat dissipation performance can be improved while reducing the distance between the boards. This contributes to downsizing of the electrical junction box.

A specific example of a board module and an electrical junction box according to the present disclosure will be described below with reference to the drawings. Note that the present disclosure is not limited to these examples, but defined by the claims, and all changes that come within the meaning and scope of equivalency of the claims are intended to be embraced therein.

Figure 2:
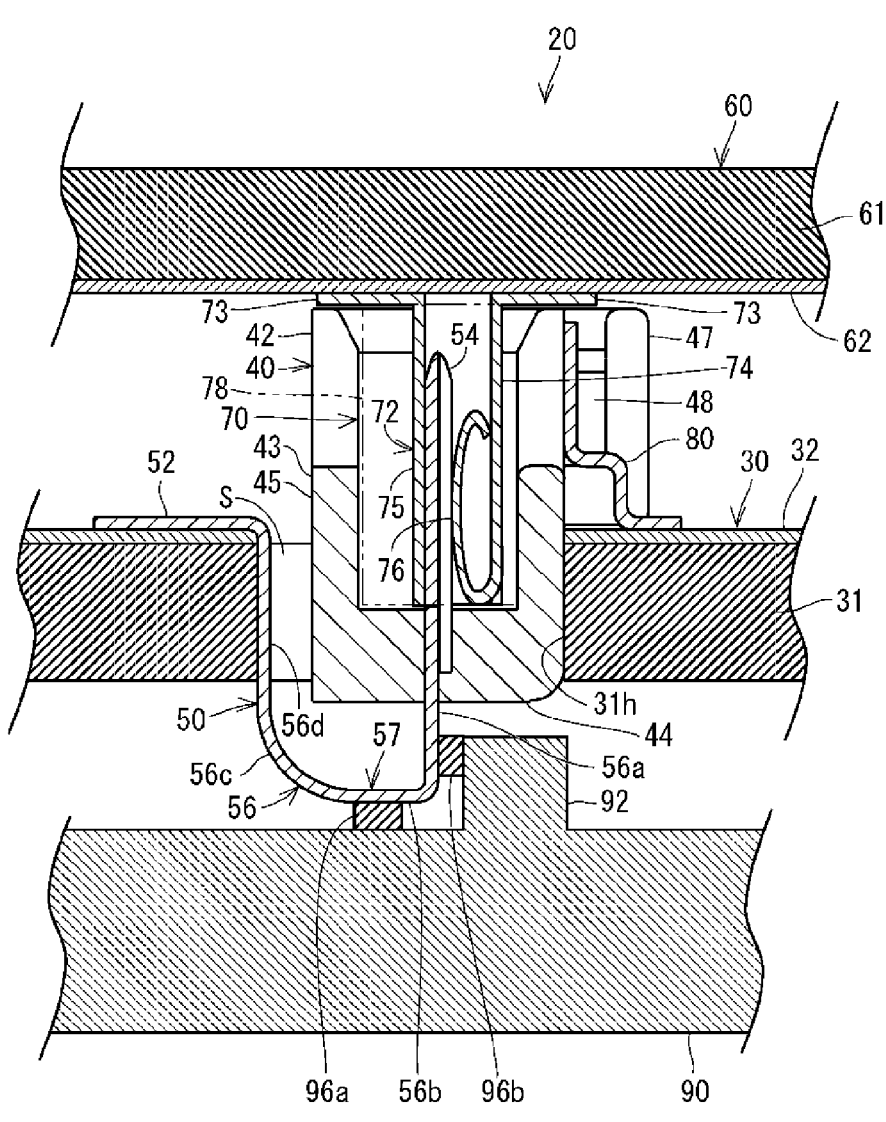
FIG. 2 is a cross-sectional view taken along line II-II in FIG. 1.
Figure 3:
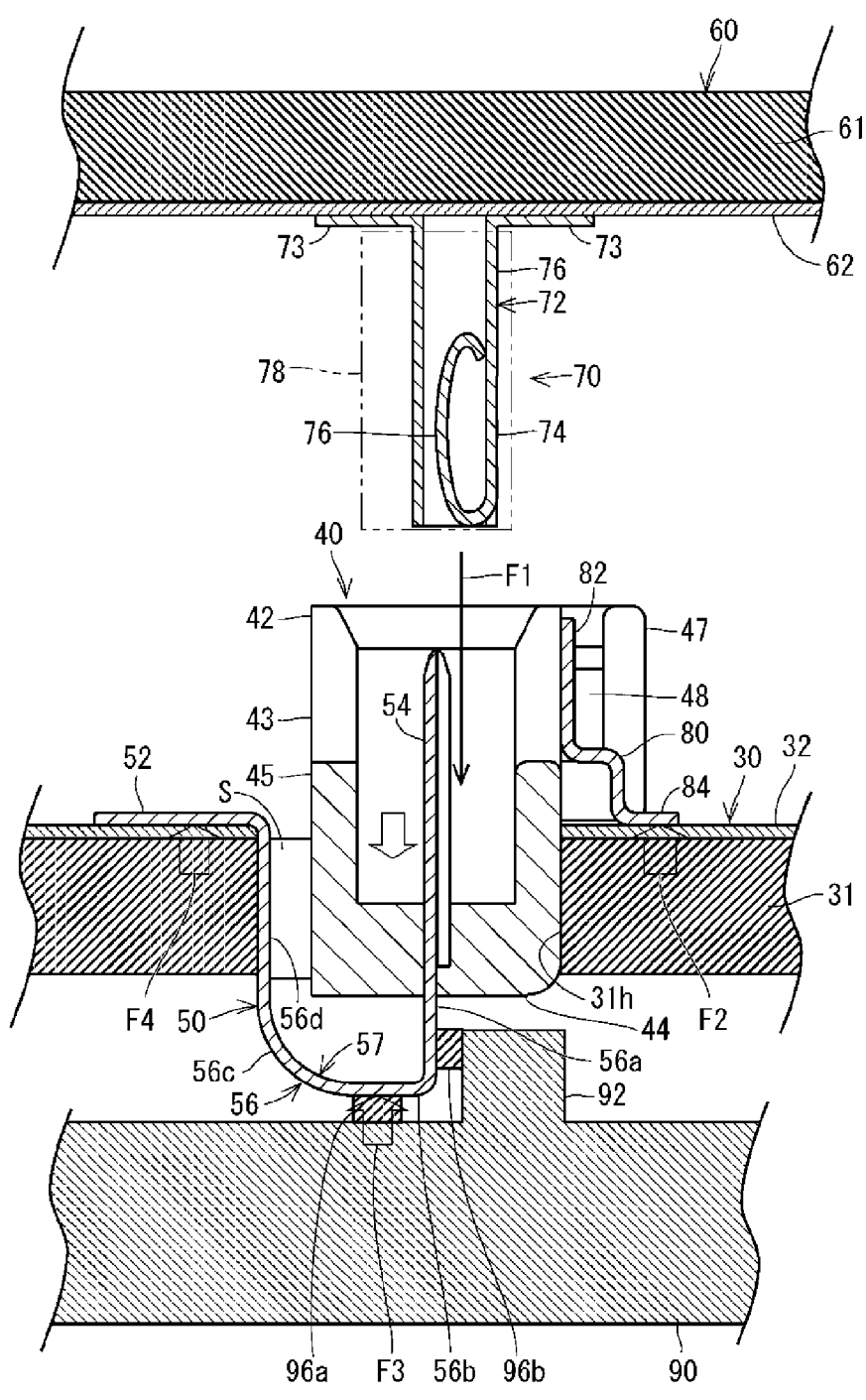
FIG. 3 is a cross-sectional view showing a state where a connector is being connected.

Hereinafter, a board module and an electrical junction box according to an embodiment will be described. FIG. 1 is a schematic perspective view showing an electrical junction box 10 provided with a board module 20. FIG. 2 is a cross-sectional view taken along line II-II in FIG. 1. FIG. 3 is a cross-sectional view showing a state where a connector is being connected.

Overall Configuration

The electrical junction box 10 is a component that is connected between electrical components to electrically connect the electrical components. For example, the electrical junction box 10 is disposed on a power supply path between a power supply such as a battery and a load such as a vehicle-mounted electrical component (e.g., lamp or a wiper) in a vehicle. The electrical junction box 10 may perform power distribution, power on/off, and the like on the power supply path.

The electrical junction box 10 includes a board module 20 and a case 12.

The case 12 is a member that covers the board module 20. The case 12 is made of resin or the like, and has a box-like shape that covers the upper side and four peripheral sides of the board module. A bottom opening of the case 12 may be closed by a heat dissipation promotion member 90. In this case, the heat dissipation promotion member 90 can be exposed to the outside of the case 12 and easily dissipate heat to the outside. The bottom opening of the case 12 may be closed by a bottom plate other than the heat dissipation promotion member 90.

The board module 20 includes a first board 30, a first connector 40, a second board 60, and a second connector 70.

The first board 30 includes a first circuit 32. The second board 60 includes a second circuit 62. The second board 60 is parallel with the first board 30 with an interval therebetween. The first board 30 is provided with the first connector 40, and the second board 60 is provided with the second connector 70. Due to connection between the first connector 40 and the second connector 70, the first circuit 32 and the second circuit 62 are electrically connected to each other.

More specifically, a circuit for performing on/off control of a power circuit is formed on each of the first board 30 and the second board 60.

For example, the first board 30 includes a power circuit, a switching element inserted into an intermediate portion of the power circuit, and a signal circuit that allows signals for performing on/off control of the switching element to flow therethrough. The power circuit is formed by a bus bar formed by a metal plate or the like, for example. The switching element is, for example, a field effect transistor (FET). The signal circuit is a circuit pattern formed by etching a copper foil, for example. The switching element is mounted on the first board 30 by being soldered to the power circuit and the signal circuit, for example.

For example, the second board 60 includes a semiconductor chip and a signal circuit. The semiconductor chip is, for example, an IC (Integrated Circuit) on which an electronic circuit for performing the on/off control of a switching element is formed. The signal circuit is a circuit pattern formed by etching a copper foil, for example.

The first circuit 32 of the first board 30 and the second circuit 62 of the second board 60 are power circuits or signal circuits. For example, the first circuit 32 is a signal circuit of the first board 30, and the second circuit 62 is signal circuit of the second board 60. In this case, as a result of the first circuit 32 and the second circuit 62 being connected to each other via the first connector 40 and the second connector 70, the on/off control of the switching element mounted on the first board 30 can be performed by the semiconductor chip mounted on the second board 60.

Examples of the circuits formed on the first board 30 and the second board 60 are not limited to the above examples. For example, a configuration is also possible in which a power circuit is formed on both the first board 30 and the second board 60, and the power circuit of the first board 30 is the first circuit 32 and the power circuit of the second board 60 is the second circuit 62. In this case, the first connector 40 and the second connector 70 may connect the power circuit formed on the first board 30 and the power circuit formed on the second board 60 to each other. The first board 30 may be a board including a circuit other than the first circuit 32, such as a double-sided circuit board or a multi-layer circuit board. Similarly, the second board 60 may be a board including a circuit other than the second circuit 62, such as a double-sided circuit board or a multi-layer circuit board.

Hereinafter, the first connector 40 and the second connector 70 will be described in more detail, on the assumption that the first circuit 32 is provided on a surface on the second board 60 side of a board body 31 of the first board 30, and the second circuit 62 is provided on the first board 30 side of a board body 61 of the second board 60.

First Connector

The first connector 40 is a connector that is mounted on the first board 30. A through hole 31*h* is formed in the board body 31 of the first board 30. Here, the through hole 31*h* has a square shape. The first circuit 32 is formed on at least a portion of the periphery of the through hole 31*h* on a surface of the board body 31 on the second board 60 side.

The first connector 40 includes a connector housing 42 and a first terminal 50.

The connector housing 42 is made of an insulating material such as resin. The connector housing 42 is disposed in the through hole 31*h* while holding the first terminal 50, and is held by the first board 30. In this manner, the first terminal 50 is held at a constant position and in a constant orientation with respect to the first board 30.

The first terminal 50 is a member formed by, for example, pressing a metal plate, and includes a first board-side end portion 52, a first terminal portion 54, and an intermediate portion 56.

The first board-side end portion 52 is electrically and mechanically connected to the first circuit 32. Here, "the first board-side end portion 52 is electrically and mechanically connected to the first circuit 32" means the first board-side end portion 52 and the first circuit 32 are connected to each other in such a manner that an electrical current can flow between the first board-side end portion 52 and the first circuit 32, and the first board-side end portion 52 and the first circuit 32 are held so as to maintain a constant positional relationship. For example, if the first board-side end portion 52 is soldered to the first circuit 32, the first board-side end portion 52 is electrically and mechanically connected to the first circuit 32. This also applies to the relationship between a second board side connection portion 73 and the second circuit 62 (described later).

The first terminal portion 54 is held by the connector housing 42. The orientation of the first terminal portion 54 held in the connector housing 42 is an orientation suitable for connection to a second terminal portion 74 of the second connector 70, and in this case, the orientation is perpendicular to the first board 30.

The intermediate portion 56 is provided between the first board-side end portion 52 and the first terminal portion 54. The intermediate portion 56 is a portion that connects the first board-side end portion 52 and the first terminal portion 54 to each other. The intermediate portion 56 includes a heat dissipation portion 57 exposed to the opposite side to the second board 60. The heat dissipation portion 57 is a portion that is exposed from the connector housing 42 as seen from the opposite side to the second board 60. Note that, "the heat dissipation portion 57 is exposed from the connector housing 42 as seen from the opposite side to the second board 60" means that at least a portion of the heat dissipation portion 57 is not hidden by the connector housing 42 but can be seen when seen from the opposite side to the second board 60.

Figure 4:
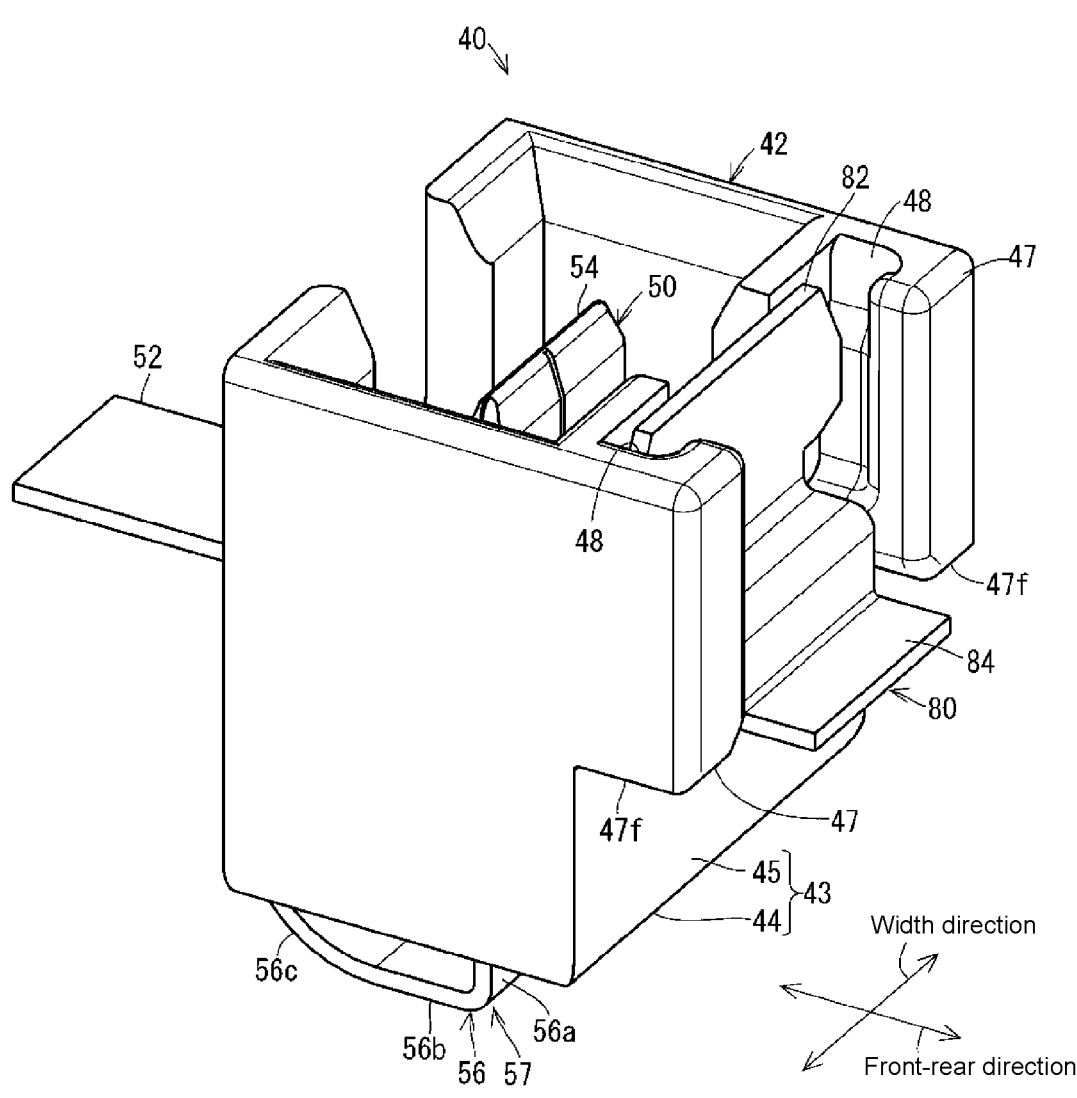
FIG. 4 is a perspective view showing a first connector.
Figure 5:
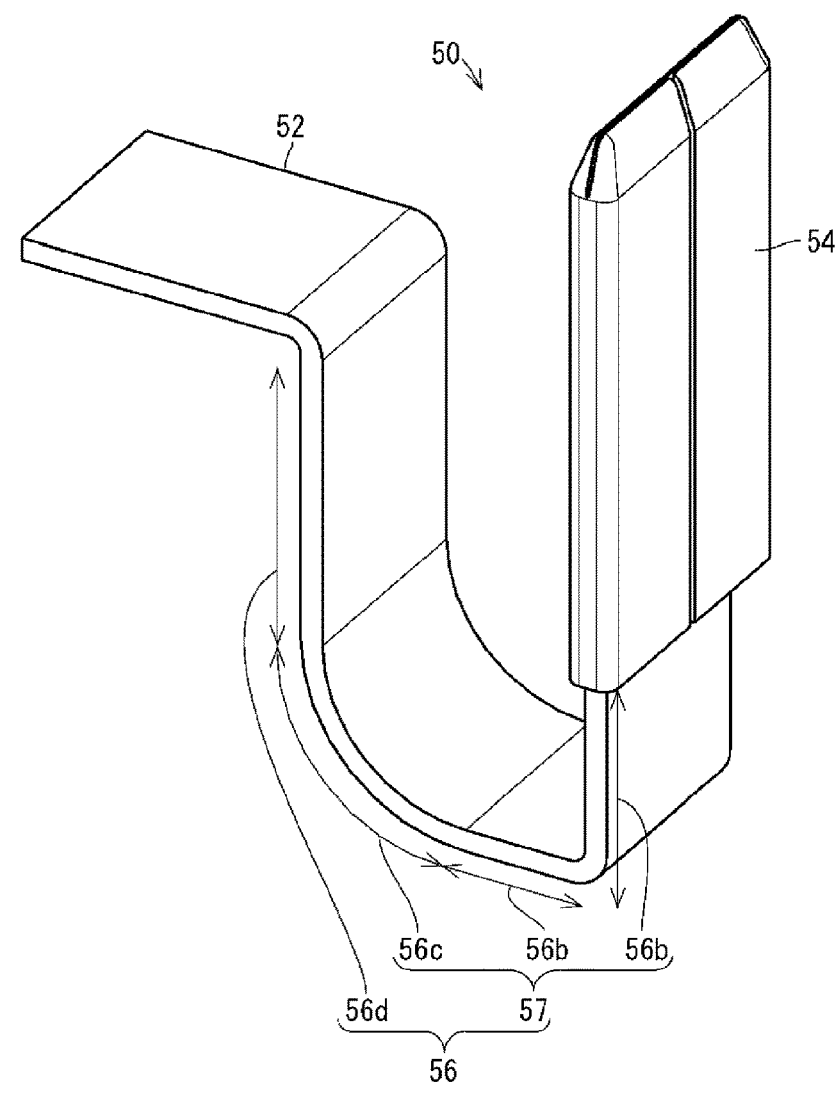
FIG. 5 is a perspective view showing a first terminal.

The first connector 40 will be described in more detail. FIG. 4 is a perspective view showing the first connector 40. FIG. 5 is a perspective view showing the first terminal 50. As shown in FIGS. 1 to 5, the first connector 40 has a configuration in which the first terminal 50 is held by the connector housing 42.

The connector housing 42 is a component formed by molding resin, for example. The connector housing 42 includes a housing body portion 43 formed into a bottomed tubular shape. In this case, the housing body portion 43 is formed into a square bottomed tubular shape having a square bottom portion 44, and a circumferential wall portion 45 that stands toward one side from the circumference of the bottom portion 44.

For convenience, a direction extending along one side of the bottom portion 44 is the width direction, and a direction orthogonal to the width direction is the front-rear direction (see FIG. 4). The dimension of the housing body portion 43 in the width direction is substantially the same as the width dimension of the through hole 31*h* in the same direction. In this manner, the housing body portion 43 is positioned in the width direction in the through hole 31*h*. The dimension of the housing body portion 43 in the front-rear direction is set smaller than the dimension of the through hole 31*h* in the same direction. In the state where the housing body portion 43 is disposed inside the through hole 31*h*, a gap S is formed between the housing body portion 43 and the through hole 31*h* on one side in the front-rear direction. The intermediate portion 56 (described later) of the first terminal 50 can pass through the gap S.

In the present embodiment, slits that extend from an opening of the housing body portion 43 toward the bottom portion 44 are respectively formed in front and rear portions of the circumferential wall portion 45 of the housing body portion 43. The slits may be omitted.

The connector housing 42 includes a pair of holding pieces 47. The pair of holding pieces 47 protrude outward from a portion of the circumferential wall portion 45 of the housing body portion 43, near the opening. In this case, the pair of holding pieces 47 protrude outward from two edges of wall portions on one side of the circumferential wall portion 45 in the front-rear direction. A pair of holding grooves 48 are formed at portions of the pair of holding pieces 47 that oppose each other. The pair of holding grooves 48 each have a groove-like shape and extend from the opening side toward the bottom portion 44 of the housing body portion 43. Portions of the pair of holding grooves 48 near the bottom portion 44 protrude relative to portions near the opening. Accordingly, the distance between the bottom portions of the pair of holding grooves 48 is smaller in the region near the bottom portion 44 than that in the region near the opening.

Outward surfaces 47*f* on the bottom portion 44 side of the pair of the holding pieces 47 are located in an intermediate axial portion of the circumferential wall portion 45 and face toward the bottom portion 44. In the state where the housing body portion 43 is disposed in the through hole 31*h*, the outward surfaces 47*f* can come into contact with the first board 30 from the second board 60 side. Even if the pair of holding pieces 47 have no peg member 80, the pair of holding pieces 47 protrude outward from the housing body portion 43 and come into contact with the first board 30 from the second board 60 side, and serve to take on an insertion force that is applied when the second connector 70 is inserted into the first connector 40.

The first terminal 50 is formed by, for example, pressing a band-like metal plate made of copper, a copper alloy, aluminum, an aluminum alloy or the like. One end portion of the first terminal 50 is the first board-side end portion 52, and the other end portion of the first terminal 50 is the first terminal portion 54. A portion of the first terminal 50 between the first board-side end portion 52 and the first terminal portion 54 is the intermediate portion 56.

A base end portion of the first terminal portion 54 is held by the bottom portion 44 so as to stand upright. The first terminal portion 54 passes inside the circumferential wall portion 45 from the bottom portion 44 and extends toward an opening of the housing body portion 43. Here, the first terminal portion 54 is formed by folding back two end portions of the plate-like portion before being pressed, so as to overlap each other. In other words, the first terminal portion 54 has a thickness dimension twice the thickness dimension of the plate member serving as the base material thereof. In doing so, the first terminal portion 54 is unlikely to bend. It is not essential that the first terminal portion 54 has a two-layer structure formed by folding back a plate or the like. The second terminal portion 74 is connected to the first terminal portion 54. The direction in which the first terminal portion 54 extends is the same as the direction in which the first terminal portion 54 and the second terminal portion 74 are connected to each other. Also, the direction in which the first terminal portion 54 and the second terminal portion 74 are connected to each other is the same as the direction in which the first connector 40 and the second connector 70 are connected to each other.

Note that the first terminal portion 54 may be supported by the bottom portion 44 using any configuration. For example, a configuration is also possible in which the first terminal portion 54 is held by the bottom portion 44 due to the first terminal portion 54 being pressed into the through hole 31*h* formed in the bottom portion 44. Alternatively, a configuration is also possible in which the first terminal portion 54 is held by the bottom portion 44 as a result of the connector housing 42 being molded using the first terminal portion 54 as an insert component.

The intermediate portion 56 passes the outer side of the bottom portion 44 and the outer side of the circumferential wall portion 45 from the base end portion of the first terminal portion 54 and reaches an axial intermediate position of the circumferential wall portion 45. More specifically, the intermediate portion 56 includes a hanging portion 56*a*, a lateral extending portion 56*b*, a bent portion 56*c*, and an in-hole portion 56*d*.

The hanging portion 56*a* extends in a direction intersecting (here, orthogonal to) the bottom portion 44 from the base end portion of the first terminal portion 54 outward of the bottom portion 44. The lateral extending portion 56*b* extends in a direction intersecting (here, orthogonal to) the hanging portion 56*a* from an end portion of the hanging portion 56*a*. The lateral extending portion 56*b* extends toward the opposite side to the pair of holding pieces 47 in the front-rear direction. The bent portion 56*c* is bent toward the opening of the connector housing 42 while curving from an end portion of the lateral extending portion 56*b*. The in-hole portion 56*d* extends from an end portion of the bent portion 56*c* toward the axially intermediate portion of the connector housing 42 along the axial direction of the connector housing 42. A gap is provided between the intermediate portion 56 and the outer surface of the connector housing 42. In the present embodiment, of the first terminal 50, the heat dissipation portion 57 exposed as seen from the opposite side to the second board includes the hanging portion 56*a*, the lateral extending portion 56*b*, and the bent portion 56*c*. The hanging portion 56*a*, the lateral extending portion 56*b*, and the bent portion 56*c*, which are an example of the heat dissipation portion 57, can also be understood as being portions protruding to the opposite side to the second board 60 with respect to the connector housing 42.

Also, the bent portion 56*c* is not held by the connector housing 42 and the first board 30. While the first terminal portion 54 has a two-layer folded structure, the bent portion 56*c* is a single plate structure and thinner than the first terminal portion 54. In addition, since the bent portion 56*c* is curved, the entirety of the bent portion 56 can be easily deformed. For this reason, in the first terminal 50, the bent portion 56*c* serves as a stress absorption portion that can be easily deformed. Also, the stress absorption portion of the first terminal 50 can be realized as a result of at least either the first terminal portion 54 being thin or having a shape that enables easy bending of the first terminal portion 54.

The first board-side end portion 52 extends from an end portion of the intermediate portion 56 that is on the opposite side to the first terminal portion 54 in a direction intersecting (here, orthogonal to) the direction in which the first terminal portion 54 extends. The first board-side end portion 52 extends outward in the opposite direction to the pair of holding pieces 47. In the axial direction of the connector housing 42, the position at which the first board-side end portion 52 extends is the same as the end portion of a leg portion 84 of the peg member 80 (described later). The first board-side end portion 52 is electrically and mechanically connected to the first circuit 32 of the first board 30.

Figure 6:
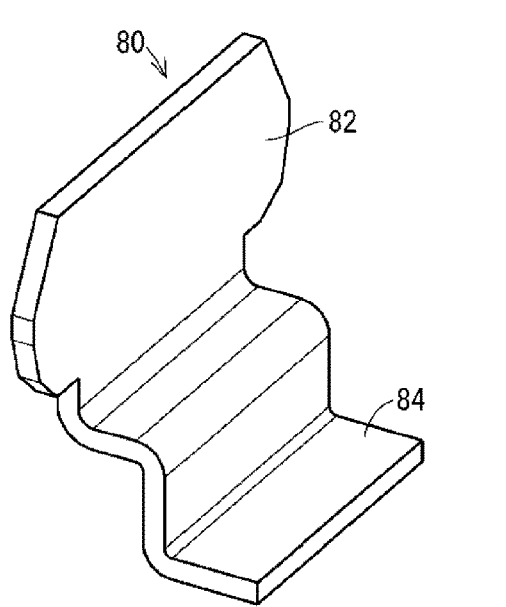
FIG. 6 is a perspective view showing a peg member.

The first connector 40 includes the peg member 80. FIG. 6 is a perspective view showing the peg member 80. As shown in FIGS. 2 to 4 and FIG. 6, the peg member 80 is a member that is held by the connector housing 42 and is in contact with the first board 30 from the second board 60 side.

More specifically, similarly to the first terminal 50, the peg member 80 is formed by pressing a metal plate or the like. The peg member 80 may also be made of resin.

The peg member 80 includes a base portion 82 and a leg portion 84. The base portion 82 has a plate-like shape. Widths of side portions of the base portion 82 gradually increase from the end portions on the bottom portion 44 side, and are largest at an intermediate portion of the base portion 82 in the extending direction. The maximum dimension in the width direction of the base portion 82 is smaller than the distance between the pair of holding grooves 48 on the opening side, and larger than the distance between the pair of holding grooves 48 on the bottom portion 44 side.

The leg portion 84 extends outward from the end portion on the bottom portion 44 side of the base portion 82, then extends from the portion extending outward toward the bottom portion 44, and then extends from the portion on the bottom portion 44 side outward along a direction orthogonal to the axial direction of the connector housing 42.

As a result of the base portion 82 being pressed between the pair of holding grooves 48, and the two side portions of the base portion 82 biting into the bottom portions of the pair of holding grooves 48 near the bottom portion 44, the peg member 80 is held by the connector housing 42. In this state, the leading end portion of the leg portion 84 is located at the same position in the axial direction of the connector housing 42 as the first board-side end portion 52.

The first connector 40 is mounted to the first board 30 as follows. Specifically, the connector housing 42 is disposed in the through hole 31*h*. In this state, the intermediate portion 56 can reach the second board 60 side of the first board 30 from the outer side of the bottom portion 44 of the connector housing 42 through the gap S between the outer circumferential surface of the housing body portion 43 and the inner circumferential surface of the through hole 31*h*. The first board-side end portion 52 that is continuous with the leading end portion of the intermediate portion 56 can come into contact with the first circuit 32 on the second board 60 side of the first board 30. In this state, the leading end portion of the leg portion 84 of the peg member 80 can come into contact with the surface of the first board 30 on the second board 60 side. Also, the outward surfaces 47*f* of the pair of holding pieces 47 may also come in contact with the surface on the second board 60 side of the first board 30. The outward surfaces 47*f* may be spaced apart from the first board 30.

In this state, the first board-side end portion 52 is electrically and mechanically connected to the first circuit 32. For example, the first board-side end portion 52 is soldered to the first circuit 32. As a result, the first connector 40 is mounted and fixed to the first board 30. Note that the leg portion 84 of the peg member 80 may also be soldered to the first board 30. In this case, a configuration is also possible in which a dummy pattern that is not connected to other circuits is formed on the first board 30 and the peg member 80 is soldered to the dummy pattern.

Heat Dissipation Promotion Member

The heat dissipation portion 57 may be in contact with the heat dissipation promotion member 90 in a heat conductive manner. The heat dissipation promotion member 90 is a member for promoting heat dissipation from the first terminal 50. The heat dissipation promotion member 90 is, for example, a member that is thicker than the first terminal 50, and is made of a material with high heat conductivity such that heat from the first terminal 50 is easily transferred thereto. The heat dissipation promotion member 90 may have a configuration suitable for dissipating heat to the outside, such as a portion exposed to the outside of the case 12, a portion having a shape suitable for having an increased surface area (e.g., a fin structure, and a comb-like structure), and the like.

The heat dissipation promotion member 90 is provided spaced apart from the first board 30 on the opposite side to the second board 60 with respect to the first board 30. The heat dissipation promotion member 90, the first board 30, and the second board 60 are supported in parallel with and spaced apart from each other. For example, a configuration is also possible in which the first board 30 and the second board 60 are screwed and fixed to the heat dissipation promotion member 90, and at this time, a cylindrical boss portion 98 is interposed between the heat dissipation promotion member 90 and the first board 30, and another boss portion 98 is interposed between the first board 30 and the second board 60.

The inward facing surface of the heat dissipation promotion member 90 opposes the heat dissipation portion 57. While the first board 30 is supported at a constant position with respect to the heat dissipation promotion member 90, the heat dissipation portion 57 is disposed at a position capable of being in contact with the heat dissipation promotion member 90 in a heat-conductive manner. "The heat dissipation portion 57 is in contact with the heat dissipation promotion member 90 in a heat conductive manner" means a case where the heat dissipation portion 57 is in direct contact with the heat dissipation promotion member 90 or a case where the heat dissipation portion 57 is in contact with the heat dissipation promotion member 90 via a heat conductive member constituted of a solid or a liquid. As the heat conductive member, a material that improves adhesion to the heat dissipation portion 57 or the heat dissipation promotion member 90 or that improves the heat conductivity thereof with use of the heat conductive filler (e.g. metal powder) included therein is used. As the heat conductive member, a known heat conductive sheet, a heat conductive grease, or a heat conductive adhesive may be used. Here, an example is shown in which the lateral extending portion 56*b* of the heat dissipation portion 57 is in contact with the heat dissipation promotion member 90 via the heat conductive member 96*a*.

A protruding portion 92 is formed at a portion of the heat dissipation promotion member 90 that is adjacent to the hanging portion 56*a*. The hanging portion 56*a* is in contact with the protruding portion 92 in a heat-conductive manner as well. In the present embodiment, the hanging portion 56*a* is in contact with the protruding portion 92 via the heat conductive member 96*b*.

As a result of the hanging portion 56*a* being brought into contact with the protruding portion 92 in a heat conductive manner, heat is likely to be transferred from the heat dissipation portion 57 to the heat dissipation promotion member 90. Note that the protruding portion 92 is not essential.

The above heat dissipation promotion member 90 is an example of a receiving portion that comes in contact with the heat dissipation portion 57 from the opposite side to the second board 60 in the direction in which the first terminal 50 and the second terminal portion 74 are connected to each other. As a result of the heat dissipation promotion member 90 being in contact with the heat dissipation portion 57 from the opposite side to the second board 60, even if the first terminal 50 is pressed toward the heat dissipation promotion member 90 when the first terminal 50 and the second board 60 are connected to each other, the resulting force is taken on the heat dissipation promotion member 90. Focusing on such a role, the heat dissipation portion 57 may be in direct contact with the heat dissipation promotion member 90, or a heat conductive sheet that is unlikely to deform may be used as the heat conductive member 96*a*. Also, focusing on the function of taking on a force that acts on the heat dissipation portion 57, the heat dissipation promotion member 90 need not be a member suitable for dissipating heat to the outside.

Second Connector

The second connector 70 includes the second terminal 72 and a connector housing 78.

Similarly to the first terminal 50, the second terminal 72 is formed by pressing a metal plate, for example, and includes a second board side connection portion 73 and the second terminal portion 74.

The second terminal portion 74 is a portion connected to the first terminal portion 54 as a result of the first board 30 and the second board 60 approaching each other. In the present embodiment, the second terminal portion 74 has a configuration in which a contact piece 76 is formed inside a tubular portion 75. The tubular portion 75 is formed into a tubular shape that allows the first terminal portion 54 to be inserted thereinto, here, a square tubular shape. The contact piece 76 has a shape that can be elastically deformed inside the tubular portion 75. When the first terminal portion 54 is inserted into the tubular portion 75, the contact piece 76 elastically deforms so as to be pushed away by the first terminal portion 54, and the contact piece 76 is pressed against the first terminal portion 54 by the elastic restoring force generated by the contact piece 76 attempt to return to its original shape.

The second board side connection portion 73 is electrically and mechanically connected to the second circuit 62. In the present embodiment, the second board side connection portion 73 extends from the base end portion of the tubular portion 75 in a direction intersecting (here, orthogonal to) the axial direction of the tubular portion 75. The second board side connection portion 73 is electrically connected to the second circuit 62 on the first board 30 side with respect to the second board 60. For example, the second board side connection portion 73 is soldered to the second circuit 62 or the like. In this manner, the second terminal portion 74 is mounted and fixed to the second board 60 in an orientation of protruding from the second board 60 toward the first board 30.

The connector housing 78 is a tubular member made of resin or the like. The second terminal portion 74 is housed in the connector housing 78. As a result of the second terminal portion 74 being inserted into the connector housing 42, the second terminal portion 74 can be guided such that the first terminal portion 54 is smoothly inserted and connected inside the second terminal portion 74. The connector housing 78 may also be omitted.

Connection Work

An example of connection work between the first terminal portion 54 and the second terminal portion 74 will be described.

First, the first board 30 on which the first connector 40 is mounted is fixed to the heat dissipation promotion member 90. In this state, the lateral extending portion 56b of the heat dissipation portion 57 is in contact with the heat dissipation promotion member 90 via the heat conductive member 96a. Also, the outward surface of the hanging portion 56a is in contact with the protruding portion 92 of the heat dissipation promotion member 90 via the heat conductive member 96b.

In the above state, the second board 60 that is kept parallel with the first board 30 is moved closer to the first board 30. Then, the second connector 70 approaches the first connector 40, and the connector housing 78 is inserted into the connector housing 42. As a result, the first terminal portion 54 is inserted into the second terminal portion 74. The first terminal portion 54 is inserted into the second terminal portion 74 while pushing away the contact piece 76 of the second terminal portion 74. As a result, a force F1 that acts in a direction toward the base end side also acts on the first terminal portion 54. The force F1 of the first terminal portion 54 that acts in a direction toward the base end side is transferred to the connector housing 42. The connector housing 42 is in contact with a surface on the second board 60 side of the first board 30 via the peg member 80. As a result, the force F1 of the first terminal portion 54 that acts in a direction toward the base end side is taken on by the peg member 80 that is in contact with the first board 30 (see F2).

Also, the intermediate portion 56 of the first terminal 50 is in contact with the heat dissipation promotion member 90 as the receiving portion. For this reason, the force of the first board 30 moving toward the base end side is received by the heat dissipation promotion member 90 serving as the receiving portion as well (see F3).

Even if the force F1 that acts on the first terminal portion 54 is transferred to the intermediate portion 56, the bent portion 56c functions as a stress absorption portion that deforms in accordance with the force F1. Accordingly, the force F1 becomes unlikely to be transferred to the first board-side end portion 52 as is. As a result, the electrical and mechanical connection state between the first board-side end portion 52 and the first circuit 32 can be favorably maintained.

Also, the first board-side end portion 52 is connected to the first circuit 32 of the first board 30 from the second board 60 side, and thus, even if the force F1 is transferred to the first board-side end portion 52, the force can be effectively received by the first board 30 (see F4).

Also, since the first board-side end portion 52 is pressed in the direction toward the first circuit 32, the electrical and mechanical connection state between the second terminal 72 and the second circuit 62 can also be favorably maintained.

Effects

According to the board module 20 or the electrical junction box 10 with the above configuration, the connector housing 42 is disposed in the through hole 31h formed in the first board 30, and the first terminal portion 54 is held by the connector housing 42. As a result of the first board 30 and the second board 60 approaching each other, the first terminal portion 54 and the second terminal portion 74 are connected to each other. Here, in order to establish connection between the first terminal portion 54 and the second terminal portion 74, a certain insertion length is required. Accordingly, the first terminal portion 54 and the second terminal portion 74 are set to a length that is the insertion length or more. In the present embodiment, since at least a portion of the connector housing 42 that holds the first terminal portion 54 is disposed in the through hole 31h, it is possible to reduce the size of the connection structure by disposing a portion of the connection structure between the first connector 40 and the second connector 70 in the first board 30. Also, the distance between the first board 30 and the second board 60 can be reduced. Since the first board 30 can be disposed near the second board 60, the thickness dimension of the board module 20 can be reduced, and further, the size of the electrical junction box 10 can be reduced. Accordingly, the cost of the board module 20 and the electrical junction box 10 can be reduced.

Also, the first terminal 50 is provided between the first board-side end portion 52 and the first terminal portion 54, and includes the heat dissipation portion 57 that is exposed as seen from the opposite side to the second board 60, and thus heat generated by the first terminal 50 or the heat transferred to the first terminal 50 is efficiently dissipated, and the heat dissipation performance of the board module 20 can be improved.

In addition, as a result of the fact that the heat dissipation performance of the first terminal 50 can be improved, the first terminal portion 54 can be downsized. Also, freedom of selection of the material used for the first terminal 50 can be improved. For example, the first terminal 50 can be made of aluminum, an aluminum alloy, or the like.

Also, since the heat dissipation portion 57 protrudes to the opposite side to the second board 60 with respect to the connector housing 42, excellent heat dissipation can be achieved. Note that "the heat dissipation portion 57 protrudes to the opposite side to the second board 60 with respect to the connector housing 42" means that at least a portion of the heat dissipation portion 57 can be observed in the state of protruding from the connector housing 42 toward the opposite side to the second board 60, as seen from a direction orthogonal to the connection direction with respect to the connector 40.

Also, if the heat dissipation portion 57 is in contact with the heat dissipation promotion member 90 in a heat conductive manner, the heat of the first terminal 50 can be effectively dissipated via the heat dissipation promotion member 90.

In addition, in the direction in which the first terminal portion 54 and the second terminal portion 74 are connected to each other, if the heat dissipation promotion member 90 serving as the receiving portion is in contact with the heat dissipation portion 57 from the opposite side to the second board 60, when the first terminal portion 54 and the second terminal portion 74 are connected to each other, the force that acts on the first terminal portion 54 is taken on by the heat dissipation promotion member 90. In this manner, an excessive force is unlikely to act on the connection portion between the first board-side end portion 52 and the first circuit 32, and the connection state between the first terminal 50 and the first circuit 32 can be favorably maintained.

Also, since the bent portion 56c serving as the stress absorption portion is provided between the first board-side end portion 52 and the first terminal portion 54, when connecting the first terminal portion 54 and the second terminal portion 74 to each other, the force that acts on the first terminal portion 54 is mitigated due to deformation of the bent portion 56c, and is unlikely to be transferred to the first board-side end portion 52. In this manner, an excessive force is unlikely to act on the connection portion between the first board-side end portion 52 and the first circuit 32, and the connection state of the first terminal 50 and the first circuit 32 can be favorably maintained. In addition, even if positional displacement occurs between the first board-side end portion 52 and the first terminal portion 54 due to expansion and contraction accompanying a change in temperature, the displacement is absorbed by the bent portion 56c. In this manner, for example, the solder between the first board-side end portion 52 and the first circuit 32 is unlikely to peel off, and the thermal durability is improved.

Also, when the first terminal portion 54 and the second terminal portion 74 are connected to each other, the first terminal 50 is pressed away from the second board 60. Since the first board-side end portion 52 is electrically and mechanically connected to the first circuit 32 of the first board 30 from the second board 60 side, a force that presses the first terminal 50 can be effectively received by the first board-side end portion 52 that is in contact with the first board 30. Also, the first board-side end portion 52 is pressed toward the first circuit 32, rather than away from the first circuit 32. In this manner, the connection state between the first terminal 50 and the first circuit 32 is favorably maintained.

Also, the peg member 80 held by the connector housing 42 is in contact with the first board 30 from the second board 60 side, and thus a force that acts when the first terminal portion 54 and the second terminal portion 74 are connected to each other is received by the first board 30 via the connector housing 42 and peg member 80 from the first terminal portion 54. If the peg member 80 is made of metal, the rigidity of the connector housing 42 made of resin is reinforced, and the first connector 40 can be reliably positioned on the first board 30.

Also, the second board side connection portion 73 is electrically and mechanically connected to the second circuit 62 on the first board 30 side with respect to the second board 60. As a result, when the first terminal portion 54 is connected to the second terminal portion 74, a force that acts on the second terminal portion 74 is received by the second board 60. In this manner, the connection state between the second board side connection portion 73 and the second circuit 62 is favorably maintained.

Variations

In the present embodiment, an example in which the second connector 70 provided on the second board 60 is connected to the first connector 40. However, the second connector connected to the first connector 40 need not be a connector provided on a board. For example, the second connector may be a connector provided on an end portion of a wire harness that includes a plurality of wires.

A configuration in which the first board-side end portion 52 is connected to the first circuit 32, and a configuration in which the second board side connection portion 73 is connected to the second circuit 62 are not limited to the above example. For example, a configuration is also possible in which the first board-side end portion 52 has a pin-like shape and is soldered to the first circuit 32 while extending through a through hole formed in the first board 30. Further, a configuration is also possible in which the second board side connection portion 73 has a pin-like shape and, in a state of extending through a through hole formed in the second board 60, is soldered to the second circuit formed on a surface toward which the second board side connection portion 73 extends relative to the second board 60.

Further, the present embodiment described an example in which the first terminal portion 54 is inserted and connected to the second terminal portion 74. However, a configuration is also possible in which the second terminal portion is inserted and connected to the first terminal portion. For example, the second terminal portion may be formed into a tab-like male terminal, and the first terminal portion may be formed into a tubular female terminal.

Note that the configurations described in the above embodiment and variations can be combined as appropriate as long as no mutual contradictions arise.

The invention claimed is:

1. A board module comprising:

a first board including a first circuit; and a first connector provided on the first board, wherein the first connector is connected to a second connector, a through hole is formed in the first board, the first connector includes a connector housing disposed in the through hole and a first terminal, the first terminal includes:

a first board-side end portion that is electrically and mechanically connected to the first circuit;

a first terminal portion held by the connector housing, and a heat dissipation portion provided between the first board-side end portion and the first terminal portion and exposed from the connector housing as seen from a side opposite to the second connector, the board module further includes a receiving portion that is in contact with the heat dissipation portion from an opposite side to the first connector in a direction in which the first connector and the second connector are connected to each other, the first terminal includes a hanging portion that extends from a base end portion of the first terminal portion toward the receiving portion, a lateral extending portion that extends from an end portion of the hanging portion in a direction intersecting the hanging portion, and a stress absorption portion that is provided between the first board-side end portion and the lateral extending portion and can deform more easily than the first terminal portion, and the lateral extending portion is in contact with the receiving portion on an end portion side of the hanging portion such that a force that acts in a direction toward a base end of the first terminal portion is taken on by the receiving portion.

2. The board module according to claim 1, further comprising:

a second connector provided on a second board including a second circuit provided spaced apart from the first board;

wherein the second connector includes a second terminal including:

a second board-side end portion that is electrically and mechanically connected to the second circuit; and a second terminal portion connected to the first terminal portion as a result of the first board and the second board approaching each other.

3. The board module according to claim 2, wherein the second board-side end portion is electrically and mechanically connected to the second circuit on the first board-side with respect to the second board.

4. The board module according to claim 1, wherein the heat dissipation portion protrudes on an opposite side to the second connector with respect to the connector housing.

5. The board module according to claim 1, wherein the heat dissipation portion is in contact with a heat dissipation promotion member in a heat conductive manner.

6. The board module according to claim 1;

wherein the first board-side end portion extends in a direction intersecting a direction in which the first connector and the second connector are connected to each other, and the first board-side end portion is electrically and mechanically connected to the first circuit on the second connector side with respect to the first board.

7. The board module according to claim 1, further comprising a peg member that is held by the connector housing and in contact with the first board from the second connector side.

8. An electrical junction box comprising:

the board module according to claim 1; and a case that covers the board module.

* * * * *